(12) United States Patent
Miyamae et al.

(10) Patent No.: US 7,817,700 B2
(45) Date of Patent: Oct. 19, 2010

(54) LASER LIGHT SOURCE DEVICE AND MANUFACTURING METHOD FOR MANUFACTURING LASER LIGHT SOURCE DEVICE

(75) Inventors: Akira Miyamae, Fujimi-machi (JP); Akira Egawa, Shiojiri (JP); Arvydas Umbrasas, Cupertino, CA (US)

(73) Assignee: Seiko Epson Corporation, Tokyo (JP)

( * ) Notice: Subject to any disclaimer, the term of this patent is extended or adjusted under 35 U.S.C. 154(b) by 261 days.

(21) Appl. No.: 12/230,738

(22) Filed: Sep. 4, 2008
(Under 37 CFR 1.47)

(65) Prior Publication Data
US 2010/0054293 A1    Mar. 4, 2010

(51) Int. Cl.
*H01S 3/14* (2006.01)
(52) U.S. Cl. .................... 372/68; 372/50.12
(58) Field of Classification Search .............. 372/50.12, 372/68
See application file for complete search history.

(56) References Cited

U.S. PATENT DOCUMENTS

2004/0179559 A1*   9/2004   Butterworth et al. .......... 372/21
2005/0226302 A1*  10/2005   Lutgen ........................ 372/70

FOREIGN PATENT DOCUMENTS

JP         A-2004-363414          12/2004

* cited by examiner

*Primary Examiner*—Tod T Van Roy
(74) *Attorney, Agent, or Firm*—Oliff & Berridge PLC

(57) ABSTRACT

A manufacturing method for manufacturing a laser light source device, includes: providing a first laser element having a first emitter, a second laser element having a second emitter, and a reflection member; adjusting a relative angle between the first laser element and the reflection member; adjusting a relative angle of the second laser element relative to the first laser element by using the reflection member; and adjusting a relative rotation angle between the first laser element and the second laser element and a relative position between the first laser element and the second laser element, so that the light emitted from the first emitter is incident into the second emitter and so that the light emitted from the second emitter is incident into the first emitter.

20 Claims, 8 Drawing Sheets

LASER LIGHT SOURCE DEVICE AND MANUFACTURING METHOD FOR MANUFACTURING LASER LIGHT SOURCE DEVICE

BACKGROUND

1. Technical Field

The present invention relates to a laser light source device and a manufacturing method for manufacturing a laser light source device.

2. Related Art

A high-pressure mercury lamp has been widely used as a light source for illumination of an optical apparatus, such as a projector.

However, the high-pressure mercury lamp has problems in that color reproducibility is limited, instantaneous lighting is difficult, and the life thereof is short.

For this reason, a laser light source device is under development in such a field.

Particularly in a laser light source device with an external resonator structure, a high output can be obtained because light having a specific wavelength can be strengthened by using the external resonator.

However, depending on the wavelength, a sufficient amount of light may not be obtained only by laser oscillation.

Therefore, for example, a technique of oscillating light with a fundamental wavelength, such as infrared laser light, and then converting the infrared laser light into visible light with half of the wavelength by using a wavelength conversion element, such as a second harmonic generator (hereinafter, referred to as an "SHG"), is used.

Within a laser resonator, it is necessary to amplify laser light by leading laser light to oscillate repeatedly to continuously produce stimulated emission.

However, if optical axes deviate from each other even slightly, the laser light cannot sufficiently oscillate, resulting in a state where laser oscillation cannot be performed.

For this reason, in an external resonator type laser light source device, alignment between a laser diode including an emitter and an external resonator is very important. If alignment accuracy is not good, sufficient output cannot be obtained.

For example, as disclosed in Japanese Unexamined Patent Application, First Publication No. 2004-363414, a method for making a reflection face of an external resonant mirror a recessed surface is proposed as a method for suppressing reduction of alignment accuracy caused by thermal lensing effect of a laser excitation medium.

Japanese Unexamined Patent Application, First Publication No. 2004-363414 discloses that even if output laser beams are dispersed or inclined due to the thermal lensing effect of the laser excitation medium, the laser beams converge near the optical axis because the laser beams are reflected from a recessed reflection face of an external resonant mirror, and as a result, a sufficient output can be obtained.

However, there was a limitation in obtaining a high-output laser light even if the alignment accuracy between the laser excitation medium and the external resonant mirror was obtained by using the method disclosed in Japanese Unexamined Patent Application, First Publication No. 2004-363414.

SUMMARY

An advantage of some aspects of the invention is to provide a laser light source device in which it is possible to obtain a laser light with a higher level of output, and a manufacturing method for easily manufacturing the laser light source device.

A first aspect of the invention provides a manufacturing method for manufacturing a laser light source device, including: providing a first laser element that has a first emitter emitting light and a first formation face on which the first emitter is formed, a second laser element that has a second emitter emitting light and a second formation face on which the second emitter is formed, and a reflection member having at least one face that is a reflection face; disposing the first laser element and the second laser element so that the first formation face is opposed to the second formation face; disposing the reflection member in an optical path of the light emitted from the first laser element; adjusting a relative angle between the first formation face and the reflection face while causing the first laser element to emit the light and producing a laser oscillation between the first laser element and the reflection member; adjusting a relative angle of the second formation face relative to the first formation face by using the reflection member, while maintaining a positional relationship at which the laser oscillation is produced between the first laser element and the reflection member; and adjusting a relative rotation angle between the first laser element and the second laser element and a relative position between the first laser element and the second laser element, on a plane orthogonal to an optical path of the light emitted from the first laser element and on a plane orthogonal to an optical path of the light emitted from the second laser element, while producing laser oscillation by both the light emitted from the first laser element and the light emitted from the second laser element, so that the light emitted from the first emitter is incident into the second emitter and so that the light emitted from the second emitter is incident into the first emitter.

By the manufacturing method of the first aspect of the invention, the laser light source device is manufactured such that the light emitted from the first emitter is incident into the second emitter and the light emitted from the second emitter is incident into the first emitter.

That is, in the laser light source device that is manufactured by the manufacturing method of the first aspect of the invention, the laser elements are disposed at both ends of a laser resonator. Laser light oscillates between the two laser elements, stimulated emission is continuously caused, and the laser light is thereby amplified.

Therefore, since emitters of the two laser element are disposed inside of the laser resonator and the laser light is resonated, the gain is increased, and a laser light with a high level of output can be thereby obtained.

In addition, since an external resonant mirror is not required, a compact device can be obtained.

However, in the above laser resonator structure, in order to produce a laser oscillation with adequate large amount, it is necessary to align the emitters of the two laser element each other with a high level of precision.

Generally, the emitter of the laser element is extremely small in size compared with an external resonant mirror.

Therefore, a higher level of alignment accuracy such as several orders of μm is necessary in the invention, compared with a conventional external resonator structure in which a laser element is aligned with an external resonant mirror.

Specifically, in order to align the two laser elements with each other, it is necessary to align a positional relationship between the two laser elements in five axes. The five axes includes two relative positional directions orthogonal to the light emission direction in which the light emitted from the laser element (the two relative positional directions are orthogonal each other), two relative rotation angles around the direction orthogonal to the light emission direction in which the light emitted from the laser element, and one relative rotation angle around the light emission direction in which the light emitted from the laser element.

In the alignment in the five axes, the alignment for aligning the light emission direction in which the light emitted from the two laser elements corresponds to the alignment for aligning the relative angle between emission faces of the two laser elements.

Since a high level of alignment accuracy relative to each of the five axes is required, therefore, as a conventional alignment method, a method in which the position and the location of laser element are sequentially adjusted every axis, an optimal position is searched in a space in the five axes, and an oscillation point is thereby found, may be conceived.

However, it is great difficulty to oscillate the laser light at a primitive step of the alignment, to optimize the alignment in each of the five axes, or the like. Therefore, the above-described conventional alignment method requires much time and effort for the alignment.

In contrast, in the manufacturing method of the first aspect of the invention, as a primal step, that is, as an adjusting process for adjusting angle of first laser element, the reflection member is disposed in an optical path of the light emitted from the first laser element, and a relative angle between the first formation face and the reflection face is adjusted while causing the first laser element to emit the light and producing a laser oscillation between the first laser element and the reflection member.

In the next step, as an adjusting process for adjusting angle of second laser element, the position of the reflection member in the prior step that is the adjusting process for adjusting the angle of the first laser element is not moved, and a relative angle of the second formation face relative to the first formation face is adjusted based on the reflection member.

In a plurality of faces of the laser element, the "formation face" means a face on which the emitter is formed and means a light emitting face of the laser element.

By the above two processes, the alignment of two relative rotation angles around the direction orthogonal to the light emission direction in which the light emitted from the laser element is completed.

In the next step, as an adjusting process for adjusting angle and position, a relative rotation angle between the first laser element and the second laser element and a relative position between the first laser element and the second laser element are adjusted on a plane orthogonal to an optical path of the light emitted from the first laser element and on a plane orthogonal to an optical path of the light emitted from the second laser element, while producing laser oscillation by both the light emitted from the first laser element and the light emitted from the second laser element, so that the light emitted from the first emitter is incident into the second emitter and so that the light emitted from the second emitter is incident into the first emitter.

By the adjusting process for adjusting the angle and the position, the alignment with regard to the remaining three axes is completed.

Therefore, when the adjusting process for adjusting the angle and the position is completed, the first laser element and the second laser element can be aligned with each other so that the light emitted from the first emitter is reliably incident into the second emitter and so that the light emitted from the second emitter is reliably incident into the first emitter.

In other words, the first laser element and the second laser element can be aligned with each other so that the first emitter of the first laser element functions as an external resonator for the second laser element and so that the second emitter of the second laser element functions as an external resonator for the first laser element.

In the above-described conventional alignment method, the two laser elements must be sequentially aligned relative to each axis while adjusting the position and the location of the laser element, the alignment operation thereby requires much time and effort.

In contrast, according to the manufacturing method of the first aspect of the invention for manufacturing the laser light source device, the alignment with regard to the two axes by using the reflection member and the alignment with regard to the remaining three axes can be separately performed efficiently. It is thereby possible to reduce the time and effort required for alignment.

As a result, a laser light source device capable of obtaining laser light with a higher level of output can be easily manufactured.

It is preferable that, in the manufacturing method of the first aspect of the invention, the adjusting of the relative angle of the second formation face include: providing a light source emitting reference light; providing an optical-path changing member whose angle relative to an optical path of the reference light is adjustable, that is disposed in the optical path of the reference light, that leads the reference light to be incident into the reflection member in the same direction as a direction in which the laser light emitted from the first laser element is incident into the reflection member, and that leads the reference light to be reflected at the reflection face; determining an angle at which the optical-path changing member is set based on a relative positional relationship between the reference light that is incident into the reflection member and the reference light that has been reflected from the reflection member; substituting the second laser element for the reflection member and causing the second laser element to emit the light after determining the angle at which the optical-path changing member is set; and adjusting the relative angle of the second formation face relative to the first formation face based on the relative positional relationship between the light emitted from the second laser element through the optical-path changing member and the reference light that has been reflected from the reflection member.

In this method, as a first step, a light source emitting reference light is provided, and an optical-path changing member such as a mirror or the like is provided. The optical-path changing member whose angle relative to an optical path of the reference light is adjustable. The optical-path changing member is disposed in the optical path of the reference light. The optical-path changing member leads the reference light to be incident into the reflection member in the same direction as a direction in which the laser light emitted from the first laser element is incident into the reflection member. The optical-path changing member leads the reference light to be reflected at the reflection face. Also, an angle (installation angle) is determined at which the optical-path changing member is set based on a relative positional relationship between the reference light that is incident into the reflection member and the reference light that has been reflected from the reflection member.

Specifically, the installation angle of the optical-path changing member is determined so that, for example, the reflected light returns to the same position as the emission point at which the reference light is emitted.

As a second step, the second laser element is substituted for the reflection member and the second laser element emits the light. Also, the relative angle of the second formation face relative to the first formation face is adjusted, based on the relative positional relationship between the light emitted from the second laser element through the optical-path changing member and the reference light that has been reflected from the reflection member.

Specifically, for example, the position to which the reference light that has been reflected returns is stored. The relative angle of the second formation face is adjusted so that the light emitted from the second laser element through the optical-path changing member reaches the stored position.

In this manner, since the second formation face is indirectly aligned based on the position of the reflection member, the second formation face is aligned with the first formation face as a result.

According to this method, by using the light source emitting reference light, the first laser element is aligned with the second laser element without laser oscillation by the light emitted from the second laser element.

It is preferable that, in the manufacturing method of the first aspect of the invention, the adjusting of the relative rotation angle and the relative position include: causing at least one of the first laser element and the second laser element to emit the light, thereby oscillating the laser between the first emitter and the second emitter; and adjusting the relative rotation angle and the relative position by monitoring the output value of the laser.

According to this method, laser output value is monitored while producing laser oscillation between the first emitter and the second emitter, and it is possible to determine that the alignment is completed when the laser output value reaches maximum value.

Therefore, the alignment is optimally performed in a state of actually using the laser light source device.

It is preferable that, in the manufacturing method of the first aspect of the invention, when the light is emitted from at least one of the first laser element and the second laser element, an amount of electric power that is supplied to the first laser element be different from an amount of electric power that is supplied to the second laser element, and a relatively small amount of electric power or a relatively large amount of electric power be supplied to each of the first laser element and the second laser element. In the manufacturing method, a rotation angle and a position of the first laser element or the second laser element, to which the relatively small amount of electric power is supplied, is adjusted.

In this invention, a "small amount of electric power" means that the amount of the electric power supplied to the first laser element or the second laser element can be also zero.

That is, in this case, the rotation angle and the position of the laser element to which the electric power is not supplied may be adjusted.

When the alignment is performed while producing laser oscillation in the adjusting process for adjusting the angle and the position, an identical amount of the electric power may be supplied to the first laser element and the second laser element, however, a different amount of the electric power is preferably supplied to the first laser element and the second laser element.

In this case, the laser element to which the relatively large amount of electric power is supplied functions as an emission element mainly, and the laser element to which the relatively small amount of electric power is supplied functions as mainly an external resonant mirror.

Therefore, by aligning the two laser elements so as not to move the laser element functioning as the emission element and so as to move the laser element functioning as the external resonant mirror, the optical path is not shifted, it is thereby easy to align the emission element with the external resonant mirror.

It is preferable that, in the manufacturing method of the first aspect of the invention, the rotation angle and the position of the first laser element to which the relatively small amount of electric power is supplied be adjusted, after alternately switching the relatively small amount of electric power and the relatively large amount of electric power that are supplied to the first laser element and the second laser element, respectively. In the manufacturing method, the rotation angle and the position of the second laser element to which the relatively small amount of electric power is supplied is adjusted, after alternately switching the relatively small amount of electric power and the relatively large amount of electric power that are supplied to the first laser element and the second laser element, respectively.

Although the two laser elements have the same configurations, an operation as the emission element and an operation as the external resonant mirror may be different due to irregularity in manufacturing layer structures or the like of each laser element when analyzing each of the laser elements in detail.

For this reason, it is possible to improve the alignment with a high level of precision by repeating alignment while alternating the roles (emission element or external resonant mirror) of the first laser element and the second laser element as described above.

It is preferable that, in the manufacturing method of the first aspect of the invention, the adjusting of the relative angle of the second formation face include: adjusting the relative angle of the second formation face relative to the reflection face of the reflection member while causing the second laser element to emit the light and producing a laser oscillation between the second laser element and the reflection member.

In this method, similar to the first laser element, a relative angle of the second formation face relative to the reflection face is adjusted between the second laser element and the reflection member while producing laser oscillation.

Therefore, in a state of confronting the first laser element with the second laser element, after completion of the alignment of the first formation face relative to the reflection face of the reflection member, it is possible to align the second formation face on the opposite side of the first laser element, while the reflection member disposing the position at which the alignment is completed between the first formation face relative and the reflection member.

It is preferable that, in the manufacturing method of the first aspect of the invention, the adjusting of the relative angle of the second formation face include: causing the light emitted from the second laser element to be incident into the opposite side of the reflection member into which the light emitted from the first laser element is incident in the adjusting of the relative angle of the first formation face.

According to this method, it is possible to easily operate the alignment of the first formation face.

It is preferable that, in the manufacturing method of the first aspect of the invention, the reflection member be configured by an optically transparent plate member having one face only on which a reflection layer is formed, and the reflection layer have a first face outwardly exposed to the optically transparent plate member and a second face that is in contact with the optically transparent plate member. In the manufacturing method, one of the light emitted from the first laser element in the adjusting of the relative angle of the first formation face and the light emitted from the second laser element in the adjusting of the relative angle of the second formation face is incident into the first face of the reflection layer, and the other of the light emitted from the first laser element in the adjusting of the relative angle of the first formation face and the light emitted from the second laser element in the adjusting of the relative angle of the second formation face is incident into the second face of the reflection layer through the optically transparent plate member.

According to this method, the two laser elements are aligned with each other by using the first face and the second face of identical reflection layer. Therefore, it is possible to align the two laser elements with each other with a high level of precision, without taking the degree of parallelization between both faces of the plate member into account.

It is preferable that, in the manufacturing method of the first aspect of the invention, the reflection member have the reflection face that causes a part of the light that has been incident into the reflection member to be transmitted through. In the manufacturing method, the adjusting of the relative rotation angle and the relative position includes: disposing the reflection member in an optical path of the light emitted from the first laser element and the light emitted from the second laser element; observing a first spot that is formed by the light emitted from the first laser element and a second spot that is formed by the light emitted from the second laser element in view from a side of the reflection member; and adjusting the relative rotation angle between the first laser element and the second laser element and the relative position between the first laser element and the second laser element so that a position of the first spot is coincided with a position of the second spot.

When the reflection member having the reflection face that causes a part of the light that has been incident into the reflection member to be transmitted through is used, it is possible to determine the positions of the first spot that is formed by the light emitted from the first laser element and the second spot that is formed by the light emitted from the second laser element in view from a side of the reflection member.

Therefore, while observing both the first spot of the light emitted from the first laser element in view from one side of the reflection face and the second spot of the light emitted from the second laser element in view from the other side of the reflection face, when the relative rotation angle between the laser elements and the relative position between the laser elements are adjusted so as to coincide the position of the first spot with the position of the second spot, it is possible to easily align the laser elements with each other in the three axes.

It is preferable that, in the manufacturing method of the first aspect of the invention, the adjusting of the relative rotation angle and the relative position include: alternately producing laser oscillation by the first laser element and the laser oscillation by the second laser element.

When the laser oscillation is produced in the first laser element and the second laser element alternately, the light of one laser element does not interrupt the observing of the light of the other laser element.

Therefore, it is possible to reliably and efficiently adjust the relative rotation angle and the relative position of both the laser elements.

It is preferable that, in the manufacturing method of the first aspect of the invention, the adjusting of the relative rotation angle and the relative position include: removing the reflection member from the optical path of the light emitted from the first laser element and the light emitted from the second laser element after the reflection member was used to adjust the relative rotation angle between the first laser element and the second laser element and the relative position between the first laser element and the second laser element; causing at least one of the first laser element and the second laser element to emit the light, thereby oscillating the laser between the first emitter and the second emitter; and adjusting the relative rotation angle and the relative position by monitoring the output value of the laser.

According to this method, the reflection member is removed from the optical path after the alignment by using the reflection member has completed, laser output value is monitored while producing laser oscillation between the first emitter and the second emitter, and it is possible to align the two laser elements with each other so that the laser output value becomes maximum value.

Therefore, it is possible to align the laser elements with each other in a state of actually using the laser light source device, and to improve the alignment with a high level of precision.

It is preferable that, in the manufacturing method of the first aspect of the invention, when the light is emitted from at least one of the first laser element and the second laser element, an amount of electric power that is supplied to the first laser element be different from an amount of electric power that is supplied to the second laser element, and a relatively small amount of electric power or a relatively large amount of electric power be supplied to each of the first laser element and the second laser element. In the manufacturing method, a rotation angle and a position of the first laser element or the second laser element, to which the relatively small amount of electric power is supplied, is adjusted.

When the alignment is performed while producing laser oscillation in the adjusting process for adjusting the angle and the position, an identical amount of the electric power may be supplied to the first laser element and the second laser element. However, a different amount of the electric power is preferably supplied to the first laser element and the second laser element.

In this case, the laser element to which the relatively large amount of electric power is supplied functions as an emission element mainly, and the laser element to which the relatively small amount of electric power is supplied functions as an external resonant mirror mainly.

Therefore, by aligning the two laser elements so as not to move the laser element functioning as the emission element and so as to move the laser element functioning as the external resonant mirror, the optical path is not shifted, it is thereby easy to align the emission element with the external resonant mirror.

It is preferable that, in the manufacturing method of the first aspect of the invention, the rotation angle and the position of the first laser element to which the relatively small amount of electric power is supplied be adjusted, after alternately switching the relatively small amount of electric power and the relatively large amount of electric power that are supplied to the first laser element and the second laser element, respectively. In the manufacturing method, the rotation angle and the position of the second laser element to which the relatively small amount of electric power is supplied is adjusted, after alternately switching the relatively small amount of electric power and the relatively large amount of electric power that are supplied to the first laser element and the second laser element, respectively.

Although the two laser elements have the same configurations, an operation as the emission element and an operation as the external resonant mirror may be different due to irregularity in manufacturing layer structures or the like of each laser element when analyzing each of the laser elements in detail.

For this reason, it is possible to improve the alignment with a high level of precision by repeating alignment while alternating the roles (emission element or external resonant mirror) of the first laser element and the second laser element as described above.

It is preferable that, in the manufacturing method of the first aspect of the invention, the reflection member be configured by an optically transparent plate member having one face only on which a reflection layer is formed.

Basically, in the manufacturing method of the first aspect of the invention, each laser element is aligned based on the position of the reflection face of the reflection member.

In this case, for example, a reflection member constituted by a plate member having reflection faces formed on both sides thereof may be used.

However, when the reflection member having the reflection faces formed on both sides thereof is used, for example, and the first laser element is aligned based on one of the reflection faces and the second laser element is aligned based on the other of the reflection faces, it is impossible to align the light emission direction of the first laser element with the light emission direction of the second laser element with a high level of precision, if the reflection faces are not completely parallel.

In contrast, when using the reflection member that is configured by an optically transparent plate member having one face only on which a reflection layer is formed, that is, when using the reflection layer that has a first face outwardly exposed to the optically transparent plate member and a second face that is in contact with the optically transparent plate member, each laser element is aligned by using the front and back of identical face (reflection layer). It is possible to align the two laser elements with each other with a high level of precision without taking the degree of parallelization between both faces of the plate member into account.

It is preferable that, in the manufacturing method of the first aspect of the invention, the reflection member diffuse a part of the light that has been incident into the reflection face.

When using the reflection member diffusing a part of the light that has been incident into the reflection face, the laser light that has emitted from a laser element and that is irradiated onto the reflection member is diffused by the reflection member. It is thereby possible to determine a position of a spot formed by the laser light, by observing the spot on the reflection face.

It is preferable that the manufacturing method of the first aspect of the invention further include: disposing a wavelength conversion element that converts a basic wavelength-band of light that has been incident into the wavelength conversion element into a wavelength-band different from the basic wavelength-band of the light, in an optical path of the light emitted from the first laser element and the light emitted from the second laser element.

According to this method, it is possible to realize a laser light source device that can output the light of wavelength-band that is difficult to be directly obtained by laser oscillation.

It is preferable that the manufacturing method of the first aspect of the invention further include: disposing a wavelength separating element that separates the light that has emitted from the first laser element and the second laser element into the light of the basic wavelength-band and into light different from the light of the basic wavelength-band, between the first laser element and the wavelength conversion element, and between the second laser element and the wavelength conversion element.

According to this method, by the wavelength separating element, the light that has emitted from the first laser element and the second laser element is separated into the light of the basic wavelength-band oscillating between the first laser element and the second laser element, and into the light of the wavelength-band converted by the wavelength conversion element. It is thereby possible to extract the light whose wavelength has converted from the light that has emitted from the laser resonator to an exterior of the laser resonator.

It is preferable that, in the manufacturing method of the first aspect of the invention, the wavelength separating element reflect the light of the basic wavelength-band and transmits the light different from the light of the basic wavelength-band.

According to this method, the constitution of laser light source device is realized in which the optical path of the light of the basic wavelength-band that oscillating in the laser resonator is bent by the wavelength separating element, and the laser light source device thereby becomes compact in size.

Furthermore, it is possible to package the first laser element and the second laser element onto an identical substrate and to simplify a cooling mechanism of the laser element.

It is preferable that, in the manufacturing method of the first aspect of the invention, each of the first laser element and the second laser element include a plurality of emitters.

When using the laser element having the plurality of the emitters, it is possible to realize the laser light source device in which a high-output laser light can be obtained.

In the case of using the laser element having the plurality of the emitters, it is also possible to align a plurality of pairs of the emitters with each other with a high level of precision by the manufacturing method of the invention.

A second aspect of the invention provides a laser light source device manufactured by the manufacturing method described above, including: a first laser element that has a first emitter emitting light and a first formation face on which the first emitter is formed; and a second laser element that has a second emitter emitting light and a second formation face on which the second emitter is formed, and a reflection member having at least one face that is a reflection face.

According to the second aspect of the invention, as described above, the alignment with regard to the two axes by using the reflection member and the alignment with regard to the remaining three axes can be separately performed efficiently. In addition, it is possible to realize the laser light source device in which a high-output laser light can be obtained.

DESCRIPTION OF EXEMPLARY EMBODIMENTS

First Embodiment

Hereinafter, a first embodiment of the invention will be described with reference to FIGS. 1A to 6.

In a laser light source device according to the present invention, two laser elements are disposed so that light emitting surfaces of the laser elements are opposite each other.

Figure 1A:
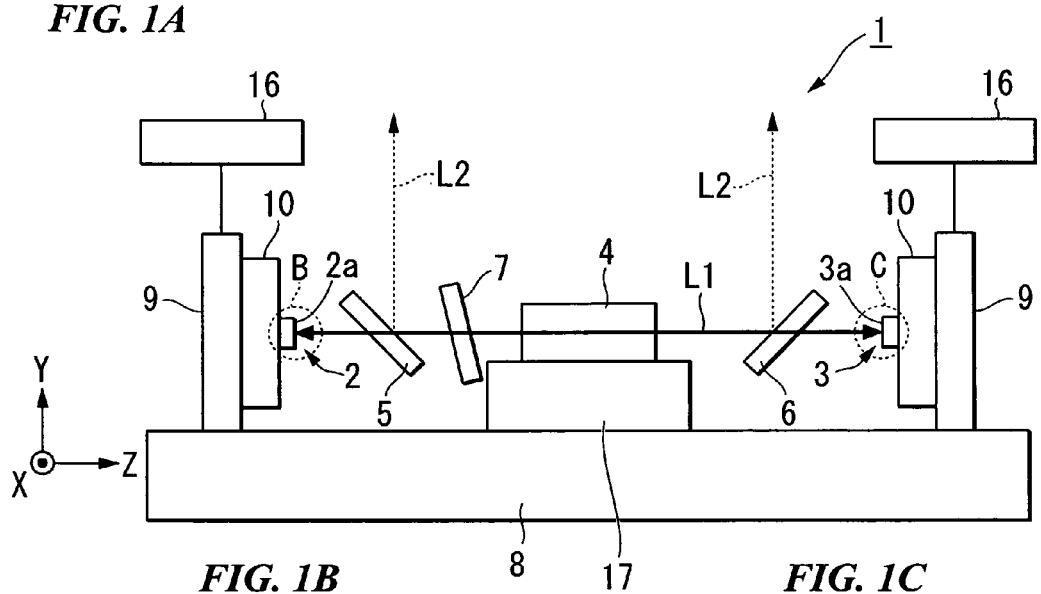
FIG. 1A is a side view showing a laser light source device according to a first embodiment of the invention.
Figure 1B:
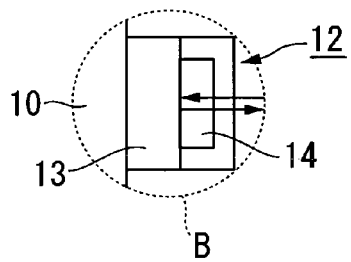
FIG. 1B is an enlarged cross-sectional view showing the area indicated by reference numeral B in FIG. 1A.

FIG. 1A shows the laser light source device according to the first embodiment. FIG. 1B cross-sectionally shows in enlargement the area indicated by reference numeral B in FIG. 1A, and FIG. 1C cross-sectionally shows in enlargement the area indicated by reference numeral C in FIG. 1A.

Figure 2:
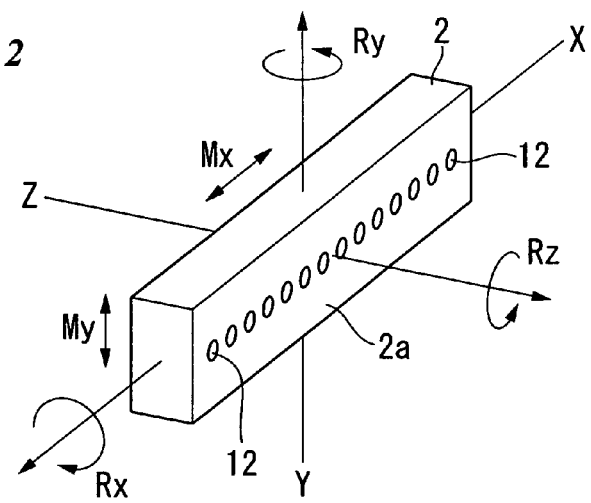
FIG. 2 is a perspective view showing adjustment axes when aligning a semiconductor laser element.

FIG. 2 illustrates adjustment axes when aligning a semiconductor laser element.

FIGS. 3 to 6 illustrate procedures in a method for manufacturing the laser light source device according to the first embodiment.

In the following drawings, the scale of each member in the drawings below has been changed appropriately to sizes that enable each member to be recognized easily.

Figure 1C:
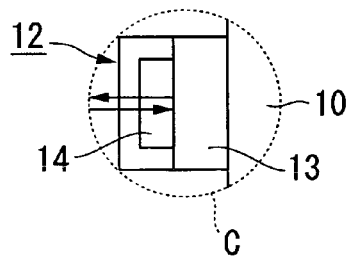
FIG. 1C is an enlarged cross-sectional view showing the area indicated by reference numeral C in FIG. 1A.

As shown in FIGS. 1A to 1C, a laser light source device 1 according to the first embodiment is configured to mainly include a first semiconductor laser element 2 (first laser element), a second semiconductor laser element 3 (second laser element), a wavelength conversion element 4, a first dichroic mirror 5 (wavelength separating element), a second dichroic mirror 6 (wavelength separating element), and a band pass filter 7.

Two holding members 9 are fixed on a base 8 with a gap therebetween, and each of the first semiconductor laser element 2 and the second semiconductor laser element 3 is fixed to the holding member 9 with a submount 10 interposed therebetween.

The submount 10 is formed of a material having good heat dissipation.

The first semiconductor laser element 2 includes an emitter (first emitter) emitting light and a first formation face 2a on which the first emitter is formed. The second semiconductor laser element 3 includes an emitter (second emitter) emitting light and a second formation face 3a on which the second emitter is formed.

The first semiconductor laser element 2 and the second semiconductor laser element 3 are mounted on the holding members 9 so that the first formation face 2a and the second formation face 3a, that is, light emitting surfaces are opposite to each other. The first semiconductor laser element 2 and the second semiconductor laser element 3 form a laser resonator.

In other words, the first semiconductor laser element 2 and the second semiconductor laser element 3 are disposed at both ends of the laser resonator and light oscillates between the semiconductor laser elements 2 and 3, so that laser oscillation occurs.

In the first embodiment, both the first semiconductor laser element 2 and the second semiconductor laser element 3 are surface emitting semiconductor laser arrays each including a plurality of emitters 12 therein, as shown in FIG. 2.

The first semiconductor laser element 2 and the second semiconductor laser element 3 have the same configuration and emit infrared laser light with a wavelength of 1060 nm.

The number of emitters 12 of each of the semiconductor laser elements 2 and 3 is 24, the pitch between the adjacent emitters 12 is approximately 330 µm, and the gap between the first semiconductor laser element 2 and the second semiconductor laser element 3, that is, the optical path length of the laser resonator is approximately 14 mm.

As shown in FIGS. 1B and 1C, the emitter 12 has a configuration in which an active layer 14 is laminated on a DBR (distributed bragg reflector) layer 13.

Here, in FIGS. 1A to 6 used in the first embodiment, an X axis, a Y axis, and a Z axis which are axes perpendicular to each other are defined as follows.

The direction (direction perpendicular to the plane of FIG. 1A) in which the plurality of emitters 12 of the first semiconductor laser element 2 and the second semiconductor laser element 3 are arrayed is defined as the X axis, the normal line direction of an upper surface of the base 8 is defined as the Y axis, and the normal line direction (that is, light emission direction) of the first formation face 2a of the first semiconductor laser element 2 and the second formation face 3a of the second semiconductor laser element 3 is defined as the Z axis.

An adjustment mechanism 16 for adjusting the position and/or installation angle of each of the semiconductor laser elements 2 and 3 is provided in each holding member 9.

As shown in FIG. 2, adjustments of total five axes including a positional adjustment in the X axis direction (Mx), a positional adjustment in the Y axis direction (My), a rotation angle adjustment around the X axis (Rx), a rotation angle adjustment around the Y axis (Ry), and a rotation angle adjustment around the Z axis (Rz) of each of the semiconductor laser elements 2 and 3 can be performed by using the adjustment mechanism 16.

In addition, the positional adjustments of the first semiconductor laser element 2 and the second semiconductor laser element 3 in the Z axis direction are needed in terms of adjustment of the resonator length but are not needed in terms of alignment of the emitters of the first semiconductor laser element 2 and the second semiconductor laser element 3.

The positions of the first and second semiconductor laser elements 2 and 3 in the Z axis direction can be adjusted by using the adjustment mechanism 16.

As shown in FIG. 1A, the wavelength conversion element 4 is disposed on the base 8 between the first semiconductor laser element 2 and the second semiconductor laser element 3.

The wavelength conversion element 4 is disposed so that laser beams emitted from the plurality of emitters 12 of each of the semiconductor laser elements 2 and 3 are incident into one end face (first end face) of the wavelength conversion element 4 and are emitted from the other end face (second end face).

PPLN (periodically poled lithium niobate) which is a nonlinear optical crystal is used as a material of the wavelength conversion element 4. The wavelength conversion element 4 serves as an SHG that converts incident light into light with approximately half of the wavelength to generate second harmonic waves.

That is, a part of light that is emitted from the first semiconductor laser element 2 and travels toward the second semiconductor laser element 3 is converted into green laser light with a wavelength of 530 nm, which is approximately half the wavelength of 1060 nm, after being transmitting through the wavelength conversion element 4.

In the same manner, a part of laser light traveling from the second semiconductor laser element 3 toward the first semiconductor laser element 2 is also converted into green laser light.

The temperature of the wavelength conversion element 4 is adjusted by a temperature adjusting mechanism 17 so that the oscillation wavelength of a laser resonator is coincided with the phase-matched wavelength of the wavelength conversion element. As a result, an adjustment is made so that a refractive index becomes a predetermined value.

The first dichroic mirror 5 is disposed between the first semiconductor laser element 2 and the wavelength conversion element 4, and the second dichroic mirror 6 is disposed between the second semiconductor laser element 3 and the wavelength conversion element 4.

The first and second dichroic mirrors 5 and 6 are provided at an angle of approximately 45° with respect to an optical path of infrared laser light L1 which oscillates between the first semiconductor laser element 2 and the second semiconductor laser element 3.

Each of the first and second dichroic mirrors 5 and 6 has a spectral characteristic that the infrared laser light L1 is transmitted therethrough and green laser light L2 is reflected therefrom.

Accordingly, since the infrared laser light L1 that oscillates between the first semiconductor laser element 2 and the second semiconductor laser element 3 and the green laser light L2 whose wavelength is converted in the wavelength conversion element 4 are separated from each other by the first and second dichroic mirrors 5 and 6, the green laser light L2 can be thereby extracted from the laser resonator to an exterior of the laser resonator.

Each of the first and second dichroic mirrors 5 and 6 is set so that the transmittance of P-polarized light is higher than that of S-polarized light.

As a result, a resonance mode of the laser resonator is set as P polarization.

That is, each of the first and second dichroic mirrors 5 and 6 also has a polarization selecting function of the laser resonator.

In addition, since the wavelength conversion function of the wavelength conversion element 4 is applied only to the case of P polarization, a resonance mode of the laser resonator is set to match the polarization axis on which the wavelength conversion function of the wavelength conversion element 4 is applied.

The band pass filter 7 (hereinafter, referred to as a "BPF") is disposed between the first dichroic mirror 5 and the wavelength conversion element 4.

The BPF 7 causes a predetermined wavelength of the wavelengths included in the laser light incident into the wavelength conversion element 4 to be transmitted therethrough, and causes the other of the wavelengths to be reflected therefrom.

Thus, the BPF 7 serves to restrict the spectrum of oscillation wavelengths.

Due to the operation of the BPF 7, the wavelength range of the oscillating laser light is narrowed. As a result, green laser light is stably output from the wavelength conversion element 4.

The normal line direction of a light incidence surface of the BPF 7 is set as a direction deviating from the incidence direction of the infrared laser light L1.

That is, the BPF 7 is provided to be inclined from the optical path within the laser resonator.

For this reason, reflected light that is reflected from the surface of the BPF 7 travels in the direction deviating from the incidence direction of the infrared laser light L1, the amount of infrared laser light L1 incident into the first semiconductor laser element 2 thereby is reduced.

Accordingly, unnecessary light other than light with a target wavelength becomes a noise component and as a result, laser oscillation between the first semiconductor laser element 2 and the BPF 7 does not occur.

Hereinafter, a method for manufacturing the laser light source device 1 having the above configuration will be described.

Here, methods for manufacturing and assembling various kinds of optical members are the same as the related art and accordingly, an explanation thereof will be omitted and a method for aligning the emitters 12 of each of the semiconductor laser elements 2 and 3 that are characteristic points of the invention will be described in detail.

Figure 3:
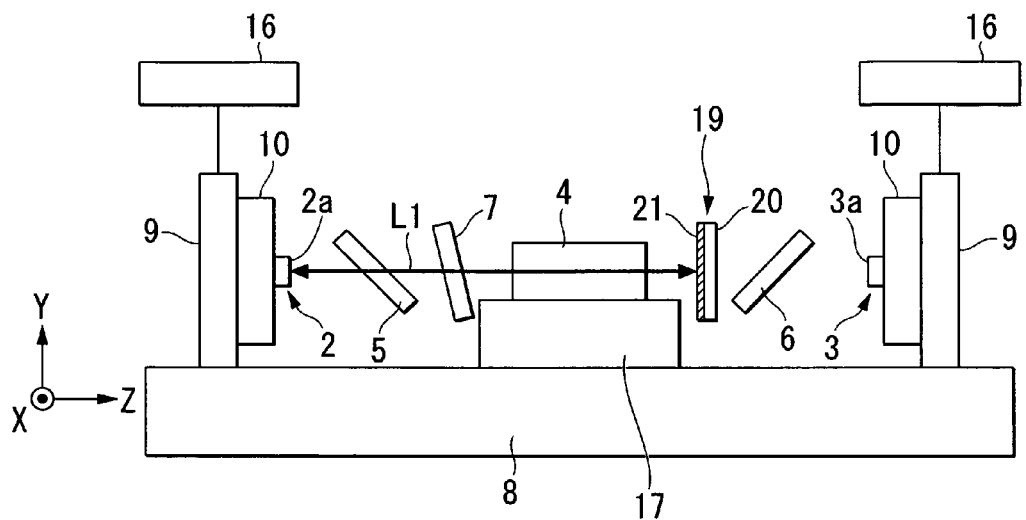
FIG. 3 is a side view illustrating a method for manufacturing the laser light source device according to the first embodiment of the invention.

In the first embodiment, a reflection mirror 19 (reflection member) is used when aligning the emitters 12 of each of the semiconductor laser elements 2 and 3, as shown in FIG. 3.

The reflection mirror 19 is obtained by forming a reflecting layer 21 (reflection layer) of a dielectric multilayer, which reflects the infrared laser light L1, on a surface of a flat glass plate 20 (optically transparent plate member) having a light transmission property.

That is, the reflecting layer 21 has a first face outwardly exposed to the flat glass plate 20 and a second face that is in contact with the flat glass plate 20.

Anti-reflective coating is performed on the other surface of the reflection mirror 19 opposite the surface on which the reflecting layer 21 is formed.

In addition, even though a one-sided mirror is used in the first embodiment, a double-sided mirror in which reflecting layers are formed on both sides of a flat plate.

The reflection mirror 19 is not a mirror that performs complete specular reflection of incident light, and fine irregularities that slightly diffuse reflected light are formed on the reflecting layer 21.

Accordingly, the position of a spot on a reflection face that is illuminated with laser light can be observed with reflected light.

In addition, the reflection mirror 19 is not a mirror having a reflectance of 100%, and cases laser light to be slightly transmitted therethrough.

Accordingly, the position of a spot of light can also be observed from a side opposite the side on which light is incident.

First, as shown in FIG. 3, optical components including the first semiconductor laser element 2, the second semiconductor laser element 3, the wavelength conversion element 4, the first dichroic mirror 5, the second dichroic mirror 6, and the BPF 7 are disposed at predetermined positions.

Then, the reflection mirror 19 is interposed between the wavelength conversion element 4 and the second dichroic mirror 6, and two axes of the first semiconductor laser element 2 are aligned by using the reflection mirror 19 (adjusting process for adjusting angle of first laser element).

As a specific alignment method, while emitting light by supplying electric power to the first semiconductor laser element 2, the reflection mirror 19 is made to function as an external resonant mirror so that light oscillates between the first semiconductor laser element 2 and the reflection mirror 19 and as a result, laser oscillation occurs.

At this time, the rotation angle adjustment (Rx shown in FIG. 2) around the X axis and the rotation angle adjustment (Ry shown in FIG. 2) around the Y axis of the first semiconductor laser element 2 are performed by using the adjustment mechanism 16 to thereby optimize the relative angle of the first formation face 2a of the first semiconductor laser element 2 with respect to the reflection face of the reflection mirror 19.

It is an object of the process to optimize the incident angle of light incident into the reflection mirror 19 from the first semiconductor laser element 2.

In the case where there is no refraction in the optical component located in the middle of the optical path, it is preferable that the incident angle of light incident into the reflection mirror 19 from the first semiconductor laser element 2 be 90°.

That is, it is the object of the process to make an adjustment so that light emitted from the emitter 12 of the first semiconductor laser element 2 is reflected from the reflection mirror 19 and then returns to the same emitter 12 with a high level of efficiency.

Thus, since this process is not a stage where emitters are aligned, the positional adjustment in the X axis direction (Mx), the positional adjustment in the Y axis direction (My), and the rotation angle adjustment around the Z axis (Rz) are not required in the process.

In the above described process in the first embodiment, the rotation angle adjustment around the X axis and the rotation angle adjustment around the Y axis of the first semiconductor laser element 2 are performed, however, a relative angle of the first formation face 2a of the first semiconductor laser element 2 relative to the reflection face of the reflection mirror 19 may be optimized by adjusting the rotation angle around the X axis and the rotation angle around the Y axis of the reflection mirror 19.

Figure 4:
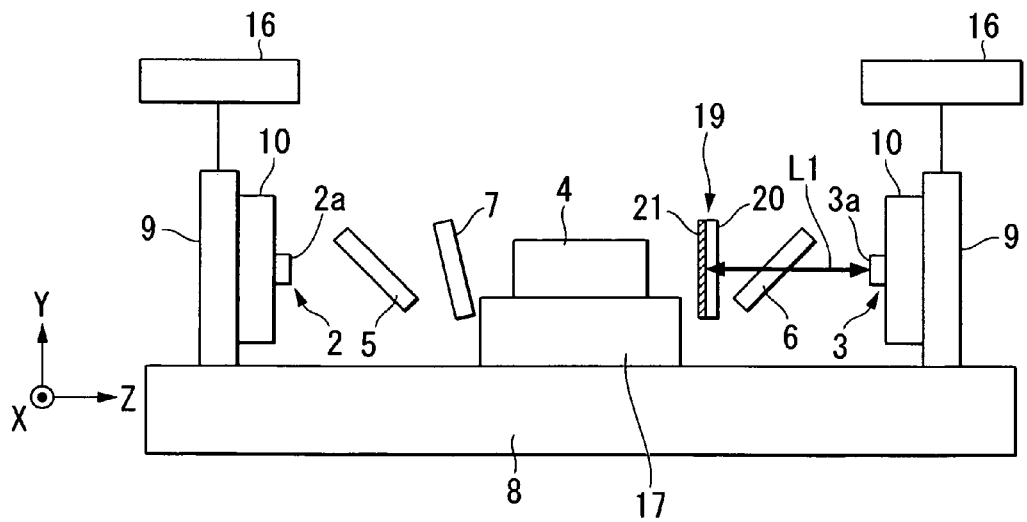
FIG. 4 is a side view illustrating the method for manufacturing the laser light source device according to the first embodiment of the invention.

Then, as shown in FIG. 4, two axes of the second semiconductor laser element 3 are aligned by performing the same operation as the previous process on the second semiconductor laser element 3 in a condition where the position or installation angle of the reflection mirror 19 is made not to be changed from the previous process (adjusting process for adjusting angle of second laser element).

Specifically, while emitting light by supplying electric power to the second semiconductor laser element 3, the reflection mirror 19 is made to function as an external resonant mirror so that laser oscillation occurs between the second semiconductor laser element 3 and the reflection mirror 19.

At this time, the rotation angle adjustment (Rx) around the X axis and the rotation angle adjustment (Ry) around the Y axis of the second semiconductor laser element 3 are performed by using the adjustment mechanism 16.

This optimizes the relative angle of the second formation face 3a of the second semiconductor laser element 3 with respect to the reflection face of the reflection mirror 19.

At this time, in the reflection mirror 19 used in the first embodiment, the reflecting layer 21 having the first face and the second face is formed on only one surface of the glass plate 20. Accordingly, the first face that is illuminated with the light emitted from the first semiconductor laser element 2 and the second face that is illuminated with the light emitted from the second semiconductor laser element 3 are front and back faces of the same reflecting layer 21.

Accordingly, in a stage where alignment of the second semiconductor laser element 3 is completed, the first formation face 2a of the first semiconductor laser element 2 and the second formation face 3a of the second semiconductor laser element 3 are made to parallel to each other with a high level of precision.

That is, the emission direction of light from the first semiconductor laser element 2 and the emission direction of light from the second semiconductor laser element 3 become parallel to each other with a high level of precision.

Figure 5A:
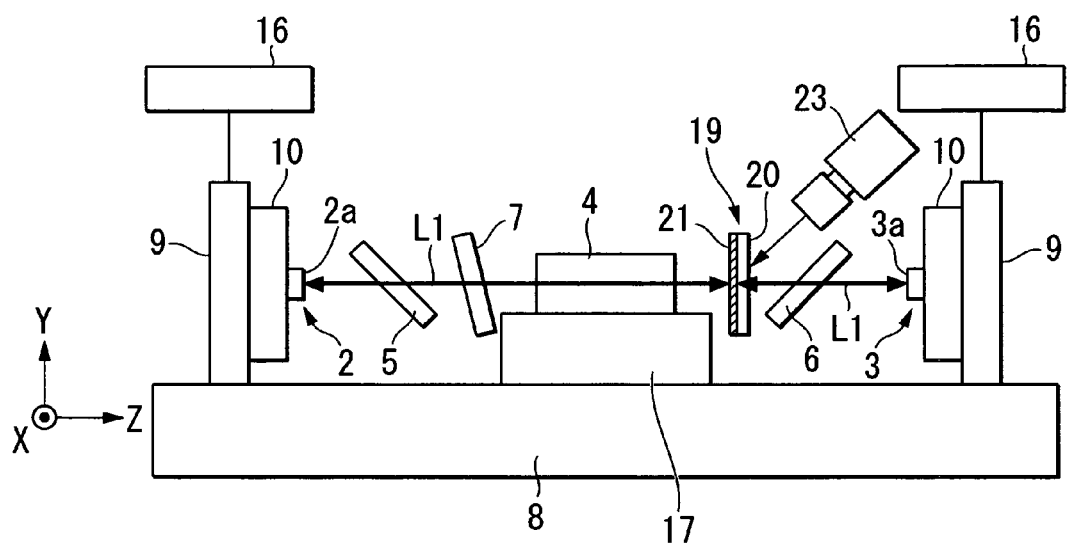
FIG. 5A is a side view illustrating the method for manufacturing the laser light source device according to the first embodiment of the invention.

Then, as shown in FIG. 5A, laser oscillation is caused to occur at both the first semiconductor laser element 2 and the second semiconductor laser element 3 in a condition where the position or installation angle of the reflection mirror 19 is made not to be changed from the previous process, so that three axes of emitters of the first semiconductor laser element 2 and the second semiconductor laser element 3 are aligned (adjusting process for adjusting angle and position).

Specifically, light is emitted by supplying electric power to both the first semiconductor laser element 2 and the second semiconductor laser element 3, and laser oscillation thereby occurs both between the first semiconductor laser element 2 and the reflection mirror 19 and between the second semiconductor laser element 3 and the reflection mirror 19.

At this time, the reflection face of the reflection mirror 19 is observed by disposing a capturing device, such as a CCD camera 23, at a side of the reflection mirror 19 where the second semiconductor laser element 3 is provided.

As described above, the reflection mirror 19 has properties of slight light transmission and light diffusion.

Therefore, even if the reflection face of the reflection mirror 19 is observed from the side where the second semiconductor laser element 3 is provided, both a spot generated by transmitted light of the light emitted from the first semiconductor laser element 2 and a spot generated by reflected light of the light emitted from the second semiconductor laser element 3 can be checked.

Although laser oscillation of the first semiconductor laser element 2 and the second semiconductor laser element 3 may be made to occur at the same time, electric power is alternately supplied to the first semiconductor laser element 2 and the second semiconductor laser element 3 so that laser oscillation alternately occurs in the first embodiment.

Figure 5B:
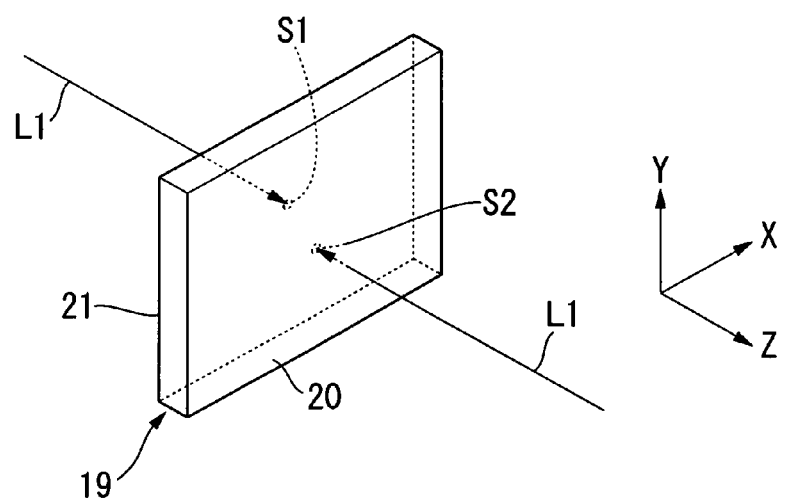
FIG. 5B is a perspective view showing a reflection mirror.

At this time, as shown in FIG. 5B, the positional adjustment in the X axis direction (Mx), the positional adjustment in the Y axis direction (My), and the rotation angle adjustment around the Z axis (Rz) of the first and second semiconductor laser elements 2 and 3 are performed by using the adjustment mechanism 16 so that a position S1 of the spot generated by the first semiconductor laser element 2 and a position S2 of the spot generated by the second semiconductor laser element 3 match each other.

This optimizes the relative rotation angles and relative positions between the first and second semiconductor laser elements 2 and 3 on a plane orthogonal to an optical path of the light emitted from the first semiconductor laser element 2 and on a plane orthogonal to an optical path of the light emitted from the second semiconductor laser element 3 (within a plane including the first formation face 2a of the of the semiconductor laser element 2 and the second formation face 3a of the second semiconductor laser element 3).

All alignments of five axes required for the laser light source device according to the embodiment of the invention are completed through this process.

In addition, although only a spot of light from one emitter is illustrated in FIG. 5B, the rotation angle adjustment around the Z axis (Rz) is also required to align all the emitters 12 because each of the semiconductor laser elements 2 and 3 practically has the plurality of emitters 12.

Figure 6:
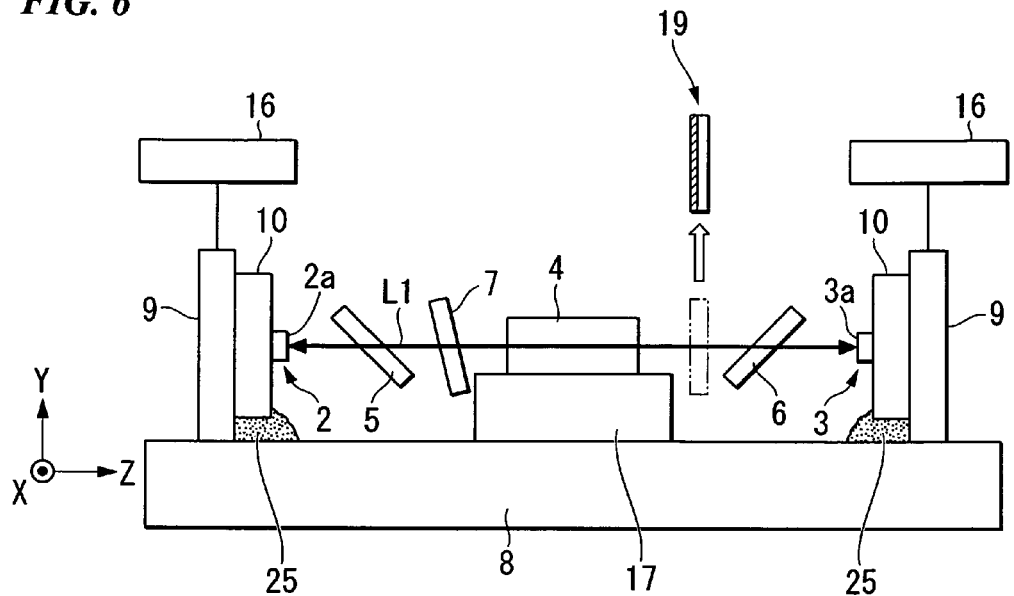
FIG. 6 is a side view illustrating the method for manufacturing the laser light source device according to the first embodiment of the invention.

Then, as shown in FIG. 6, in the case when the reflection mirror 19 is removed from the optical path of the infrared laser light L1 emitted from the first and second semiconductor laser element 2 and 3, the emitters 12 of the first and second semiconductor laser elements 2 and 3 are aligned with a high level of precision. As a result, since laser oscillation occurs between the two emitters 12, a high-output laser light is obtained.

In addition, in order to further improve the alignment accuracy, the position or installation angle of each of the first and second semiconductor laser elements 2 and 3 may be finely adjusted while producing laser oscillation in a state in which the reflection mirror 19 is removed.

At this time, the same electric power may be supplied to the first semiconductor laser element 2 and the second semiconductor laser element 3, but it is desirable to supply different electric power thereto.

In the case where different electric power is supplied, the rotation angle and position of a laser element to which smaller electric power is supplied are adjusted.

In other words, the rotation angle and the position of the first semiconductor laser element 2 to which the relatively small amount of electric power is supplied is adjusted, after alternately switching the relatively small amount of electric power and the relatively large amount of electric power that are supplied to the first semiconductor laser element 2 and the second semiconductor laser element 3, respectively. Also, the rotation angle and the position of the second semiconductor laser element 3 to which the relatively small amount of electric power is supplied is adjusted, after alternately switching the relatively small amount of electric power and the relatively large amount of electric power that are supplied to the first semiconductor laser element 2 and the second semiconductor laser element 3, respectively.

In this case, a semiconductor laser element to which a large amount of electric power is supplied mainly functions as an emission element, and a semiconductor laser element to which a small amount of electric power is supplied mainly functions as an external resonant mirror.

Accordingly, it is easy, in terms of alignment, to move the external resonant mirror without moving the emission element.

Alternatively, electric power may not be supplied to one of the semiconductor laser elements.

Then, a side to which a large amount of electric power is supplied and a side to which a small amount of electric power is supplied alternate between the first semiconductor laser element and the second semiconductor laser element and an operation of adjusting the rotation angle and position of the laser element to which a small amount of electric power is supplied is repeated a plural number of times.

Although the first semiconductor laser element 2 and the second semiconductor laser element 3 have the same configurations, an operation as an emission element and an operation as an external resonant mirror may be different due to variations in individual semiconductor laser elements.

For this reason, the alignment accuracy can be improved up to a higher level by repeating alignment while alternating the roles of the first semiconductor laser element 2 and the second semiconductor laser element 3 as described above.

After acquiring sufficient alignment accuracy through the process described above, the positions and installation angles of the first and second semiconductor laser element 2 and 3 are fixed.

For example, as shown in FIG. 6, a method for fixing the submount 10, on which the semiconductor laser elements 2 and 3 are mounted, on the base 8 with an adhesive 25 may be adopted.

As described above, according to the laser light source device 1 of the first embodiment, laser light oscillates between the first semiconductor laser element 2 and the second semiconductor laser element 3 and as a result, stimulated emission continuously occurs and the laser light is amplified.

Accordingly, since gain is increased, high-output laser light can be obtained.

In addition, since the external resonant mirror is not required, a compact device can be obtained.

In addition, according to the method for manufacturing the laser light source device 1 of the first embodiment, alignment of two axes using the reflection mirror 19 and alignment of the remaining three axes can be performed efficiently. Accordingly, time and effort required for alignment can be reduced.

As a result, a laser light source device capable of obtaining laser light with a higher level of output can be easily manufactured.

According to the method of the first embodiment, alignment of the first formation face 2a of the first semiconductor laser element 2 with respect to the reflection face of the reflection mirror 19 is completed and then alignment of the second formation face 3a of the second semiconductor laser element 3 is performed at the side opposite the first semiconductor laser element 2 in a condition where the reflection mirror 19 is disposed at the position. Accordingly, alignment of two axes can be easily performed.

In addition, the spots of light beams emitted from both the semiconductor laser elements 2 and 3 can be observed by using the CCD camera 23 from one side of the reflection mirror 19, and the relative rotation angles and relative positions of the semiconductor laser elements 2 and 3 can be adjusted so that the positions of the spots match each other. As a result, alignment of three axes can be easily performed.

In addition, since laser oscillation occurs alternately between the first semiconductor laser element 2 and the second semiconductor laser element 3 in the angular position adjusting process, a spot of one laser beam does not become an obstacle to observation of a spot of another laser beam.

Therefore, adjustment of the relative rotation angles relative positions of both the semiconductor laser elements 2 and 3 can be performed efficiently.

In addition, optical components which are not directly related to alignment, such as the wavelength conversion element 4, the first and second dichroic mirrors 5 and 6, and the BPF 7, may be disposed before aligning the first semiconductor laser element 2 and the second semiconductor laser element 3 or may be disposed after aligning the first semiconductor laser element 2 and the second semiconductor laser element 3.

In the case where the above-mentioned optical components are disposed before alignment, the alignment may be performed in consideration of an effect of the optical components.

In the case of disposing the above-mentioned optical components after alignment, the alignment work can be easily performed because there is no optical component which is obstructive at the time of alignment.

In the first embodiment, the alignment of the semiconductor laser elements 2 and 3 has been performed so that the position of the spot S1 generated by the first semiconductor laser element 2 and the position of the spot S2 generated by the second semiconductor laser element 3 match each other. However, a method of making the central axis of light emitted from the first semiconductor laser element 2 coincide with the central axis of light emitted from the second semiconductor laser element 3 may also be adopted without being limited to the above-described alignment method.

In addition, a method of observing the spots generated by the semiconductor laser elements 2 and 3 with the CCD camera 23 has been illustrated. However, any method for observing scattered light may also be used without being limited to the above-described method.

Second Embodiment

Hereinafter, a second embodiment of the invention will be described with reference to FIGS. 7 to 11.

A laser light source device according to the second embodiment is a laser light source device packaged in a shape in which an optical path in a laser resonator is bent due to a dichroic mirror.

Figure 7:
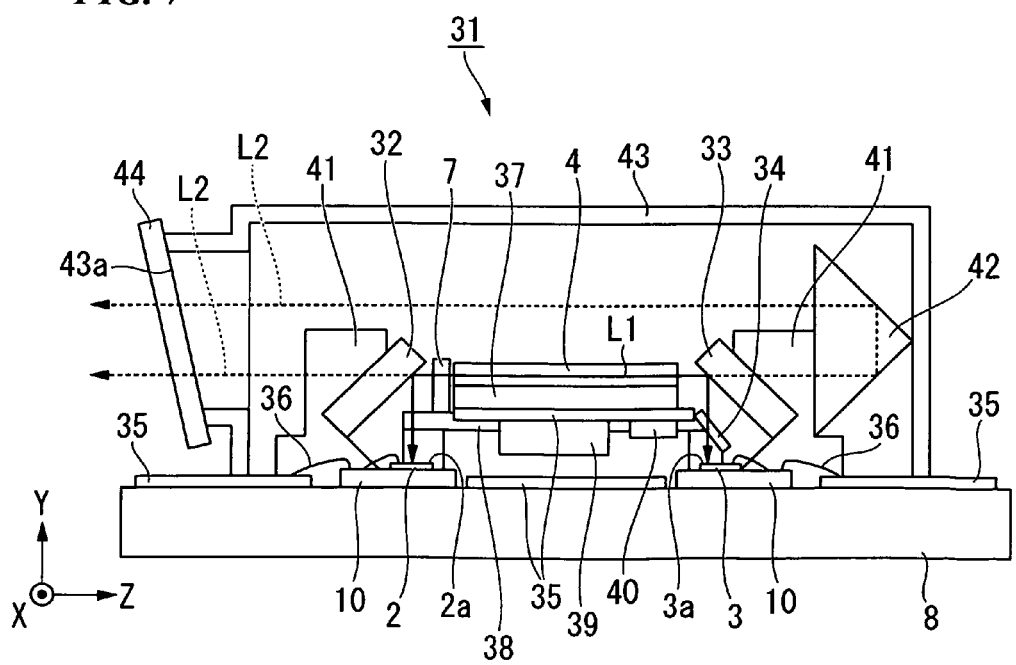
FIG. 7 is a side view showing a laser light source device according to a second embodiment of the invention.

FIG. 7 shows the laser light source device according to the second embodiment.

FIGS. 8 to 11 illustrate a method for manufacturing the laser light source device according to the second embodiment.

In addition, the same constituent components as in the first embodiment are denoted by the same reference numerals, and a detailed description thereof will be omitted.

As shown in FIG. 7, a laser light source device 31 according to the second embodiment is configured to mainly include a first semiconductor laser element 2 (first laser element), a second semiconductor laser element 3 (second laser element), a wavelength conversion element 4, a first dichroic mirror 32 (wavelength separating element), a second dichroic mirror 33 (wavelength separating element), a BPF 7, and a Brewster window 34.

Each of the first semiconductor laser element 2 and the second semiconductor laser element 3 is mounted on the base 8 with a submount 10 interposed therebetween.

In order to improve the heat dissipation property of the first and second semiconductor laser elements 2 and 3, the submount 10 or the base 8 is formed of a material having a good heat dissipation property, such as copper, ceramic, or the like.

The first semiconductor laser element 2 and the second semiconductor laser element 3 are connected to a flexible printed circuit 35 (hereinafter, referred to as an "FPC") fixed on the base 8 by a bonding wire 36, so that electric power is supplied to the first and second semiconductor laser elements 2 and 3.

In the second embodiment, since both the first formation face 2a of the first semiconductor laser element 2 and the second formation face 3a of the second semiconductor laser element 3 faces toward the vertically upward direction (normal line direction of an upper surface of the base), infrared laser light L1 is emitted toward the vertically upward direction.

Furthermore, in the second embodiment, the normal line direction (light emission direction) of the first formation face 2a of the first semiconductor laser element 2 and the second formation face 3a of the second semiconductor laser element 3 is the Y axis direction.

The wavelength conversion element 4 is disposed on the base 8 between the first semiconductor laser element 2 and the second semiconductor laser element 3.

The wavelength conversion element 4 is fixed on a frame 38 with a heat spreader 37 interposed therebetween, and a heater 39 and a thermistor 40 are provided in the frame 38.

A quasi-phase matching technique is used for wavelength conversion of the wavelength conversion element 4.

In order to satisfy quasi-phase matching, it is necessary to control a refractive index. In order to do so, it is important to strictly control the temperature.

Accordingly, the temperature of the wavelength conversion element 4 is measured by the thermistor 40, and the temperature of the wavelength conversion element 4 is controlled by supplying electric power to the heater 39 through the FPC 35 so that the temperature becomes a predetermined temperature.

Cooling of the wavelength conversion element 4 is performed by reducing the electric power supplied to the heater 39, so that the wavelength conversion element 4 is naturally cooled.

When laser oscillation starts, the wavelength conversion element 4 absorbs light and the temperature goes up naturally. However, the temperature of the wavelength conversion element 4 is controlled to a temperature larger than the naturally increased temperature, for example, approximately 80 to 90° C.

The heat spreader 37 is used for stabilization of temperature.

The first dichroic mirror 32 and the second dichroic mirror 33 are provided at upper sides of both the semiconductor laser elements 2 and 3 and lateral sides of the wavelength conversion element 4.

The first and second dichroic mirrors 32 and 33 are fixed to the frame 41 at an angle of approximately 45° with respect to the optical path of the infrared laser light L1 emitted from the first semiconductor laser element 2 and the second semiconductor laser element 3.

In the first embodiment, each of the first and second dichroic mirrors 5 and 6 has a spectral characteristic in that infrared laser light is transmitted therethrough and green laser light is reflected therefrom. In the second embodiment, however, each of the first and second dichroic mirrors 32 and 33 has a spectral characteristic that the infrared laser light is reflected therefrom and the green laser light is transmitted therethrough.

Accordingly, the optical path of the infrared laser light L1 which oscillates between the first semiconductor laser element 2 and the second semiconductor laser element 3 is bent at the positions of the first and second dichroic mirrors 32 and 33.

On the other hand, the green laser light L2 whose wavelength has been converted by the wavelength conversion element 4 is transmitted through the first and second dichroic mirrors 32 and 33 and is then extracted from inside of the wavelength conversion element 4 toward the lateral side.

The dichroic mirror generally has polarization dependency which makes P polarized light transmitted therethrough and S polarized light reflected therefrom.

In addition, the wavelength conversion element generally has a characteristic of selectively converting the wavelength of P polarized light from the reason of a manufacture process.

Then, in the second embodiment, since S polarization becomes dominant in the infrared laser light L1 which oscillates within the laser resonator, the wavelength of the infrared laser light L1 cannot be sufficiently converted in the wavelength conversion element 4.

For this reason, the Brewster window 34 is provided between the second semiconductor laser element 3 and the second dichroic mirror 33.

The Brewster window 34 is a parallel plate formed of glass and is provided at an angle which allows P polarized light to be transmitted 100%.

Accordingly, since the infrared laser light L1 which oscillates within the laser resonator becomes the P polarized light after being transmitted through the Brewster window 34, the wavelength of the infrared laser light L1 is efficiently converted by the wavelength conversion element 4.

The BPF 7 is provided between the first dichroic mirror 32 and the wavelength conversion element 4.

The BPF 7 is provided to be inclined with respect to the optical path of the infrared laser light L1, so that the reflected light does not return to the first semiconductor laser element 2.

In addition, an optical path return prism 42 is provided at the lateral side of the second dichroic mirror 33 of the frame 41.

The optical path return prism 42 is a prism having a cross section with the shape of a right triangle and can change the optical path by reflecting laser light twice within the prism.

Accordingly, the optical path of the green laser light L2 extracted from the second dichroic mirror 33 toward the right side of FIG. 7 is changed by the optical path return prism 42 and as a result, the green laser light L2 travels to the left side. That is, the green laser light L2 extracted from the second dichroic mirror 33 toward the right side of FIG. 7 travels in the same direction as the green laser light L2 extracted from the first dichroic mirror 32 toward the left side of FIG. 7.

The optical components described above are covered with a cap 43 on the base 8.

In addition, the green laser light L2 is emitted to the outside from an opening 43a provided at an end of the cap 43.

A small amount of infrared laser light is included as leaking light in the green laser light L2 emitted.

Since the infrared laser light is not preferably in terms of safety, an infrared light cutoff filter 44 is provided in the opening 43a of the cap 43. Accordingly, the green laser light L2 is emitted to the outside after the infrared laser light is removed by the infrared light cutoff filter 44.

Hereinafter, a method for manufacturing the laser light source device 31 having the above configuration will be described.

Here, the laser light source device 31 according to the second embodiment is only different from the laser light source device 1 according to the first embodiment in that the optical path of laser light within the laser resonator is bent, but the principle or method of alignment is the same as that in the first embodiment.

Therefore, in the second embodiment, the method for manufacturing the laser light source device 31 will be briefly described with reference to FIGS. 8 to 11.

In addition, only optical components required for description of an alignment method are selectively illustrated in FIGS. 8 to 11.

Figure 8:
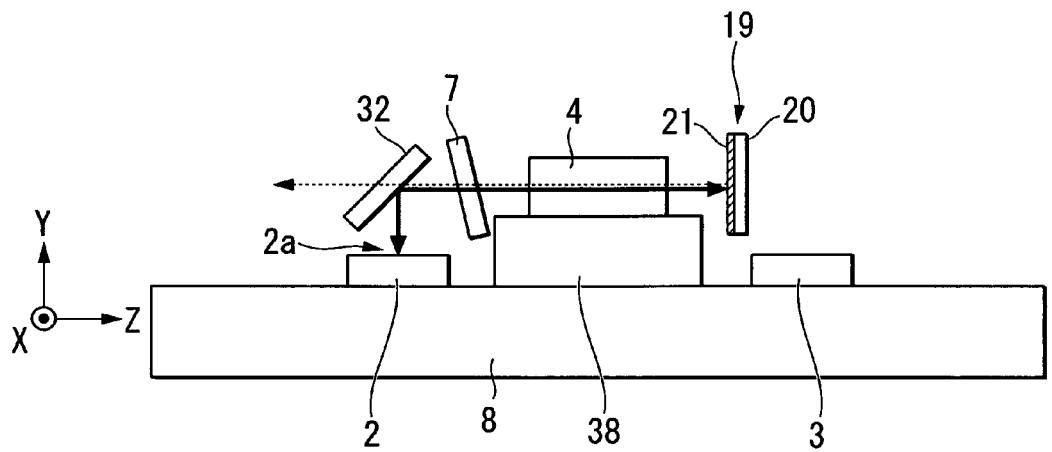
FIG. 8 is a view illustrating a method for manufacturing the laser light source device according to the second embodiment of the invention.

As shown in FIG. 8, optical components including the first semiconductor laser element 2, the second semiconductor laser element 3, the wavelength conversion element 4, the first dichroic mirror 32, and the BPF 7, or the like are disposed at predetermined positions.

Then, the reflection mirror 19 is provided at a side of the wavelength conversion element 4 not facing the first dichroic mirror 32, and two axes of the first semiconductor laser element 2 are aligned by using the reflection mirror 19 (adjusting process for adjusting angle of first laser element).

Here, laser oscillation is caused to occur between the first semiconductor laser element 2 and the reflection mirror 19.

Then, the rotation angle adjustment around the X axis and the rotation angle adjustment around the Z axis of the first semiconductor laser element 2 are performed to thereby optimize the relative angle of the first formation face 2a of the first semiconductor laser element 2 with respect to the reflection face of the reflection mirror 19.

Figure 9:
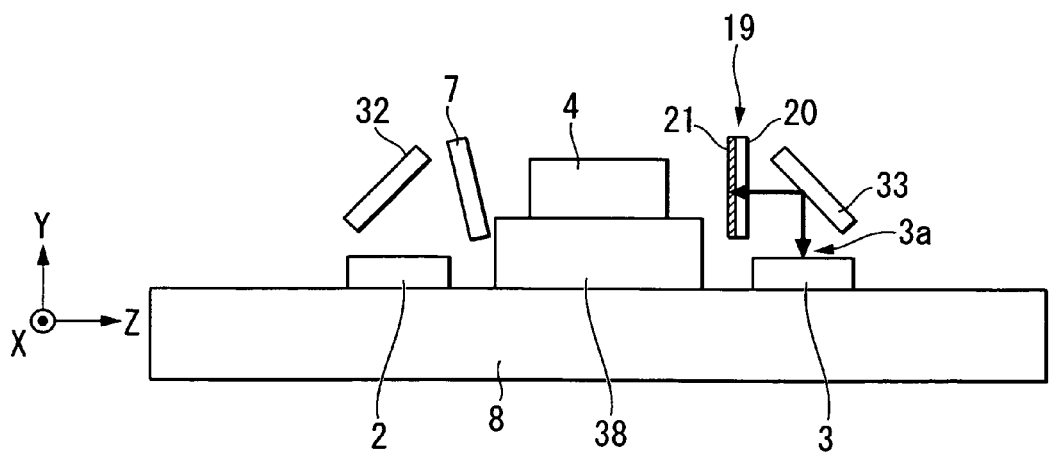
FIG. 9 is a view illustrating the method for manufacturing the laser light source device according to the second embodiment of the invention.

Then, as shown in FIG. 9, two axes of the second semiconductor laser element 3 are aligned in the same manner as the previous process by disposing the second dichroic mirror 33 at the predetermined position in a condition where the reflection mirror 19 is made not to move from the previous process (adjusting process for adjusting angle of second laser element).

At this time, laser oscillation is caused to occur between the second semiconductor laser element 3 and the reflection mirror 19, thereby optimizing the relative angle of the second formation face 3a of the second semiconductor laser element 3 with respect to the reflection face of the reflection mirror 19.

Here, the second dichroic mirror 33 is disposed at the predetermined position after the alignment of the first semiconductor laser element 2 is completed for easy work. However, the second dichroic mirror 33 may be first disposed at the predetermined position.

Figure 10:
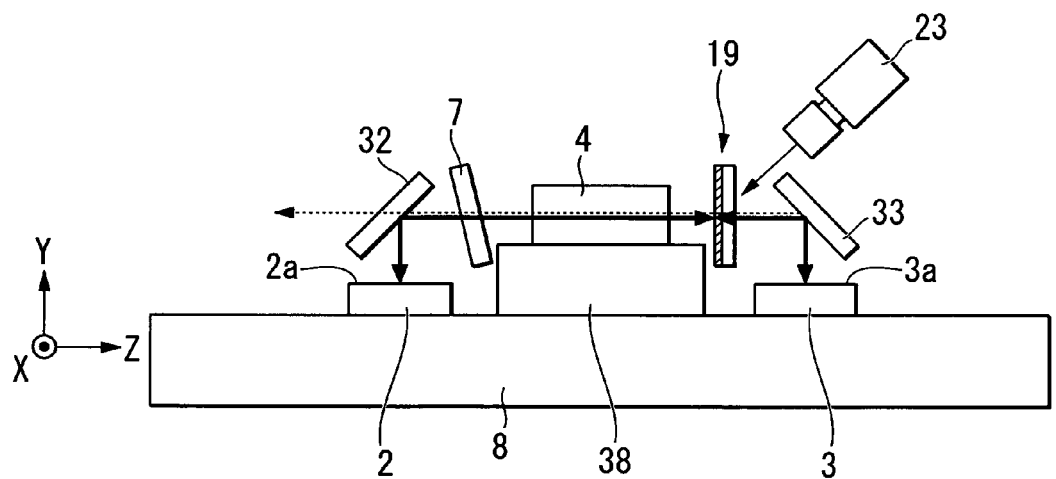
FIG. 10 is a view illustrating the method for manufacturing the laser light source device according to the second embodiment of the invention.

Then, as shown in FIG. 10, laser oscillation is caused to occur between both sides of the first semiconductor laser element 2 and the second semiconductor laser element 3 in a condition where the reflection mirror 19 is made not to move from the previous process.

Then, three axes of emitters of the first semiconductor laser element 2 and the second semiconductor laser element 3 are aligned while observing the positions of two spots with the CCD camera 23 from one side of the reflection mirror 19 (adjusting process for adjusting angle and position).

At this time, similar to the first embodiment, it is preferable to cause laser oscillation to alternately occur between the first semiconductor laser element 2 and the second semiconductor laser element 3.

Then, the positional adjustment in the X axis direction, the positional adjustment in the Z axis direction, and the rotation angle adjustment around the Y axis of the first and second semiconductor laser elements 2 and 3 are performed so that the positions of both the spots match each other.

This optimizes the relative rotation angles and relative positions of the first and second semiconductor laser elements 2 and 3 on a plane orthogonal to an optical path of the light emitted from the first semiconductor laser element 2 and on a plane orthogonal to an optical path of the light emitted from the second semiconductor laser element 3 (within a plane including the first formation face 2a of the first semiconductor laser element 2 and the second formation face 3a of the second semiconductor laser element 3).

Figure 11:
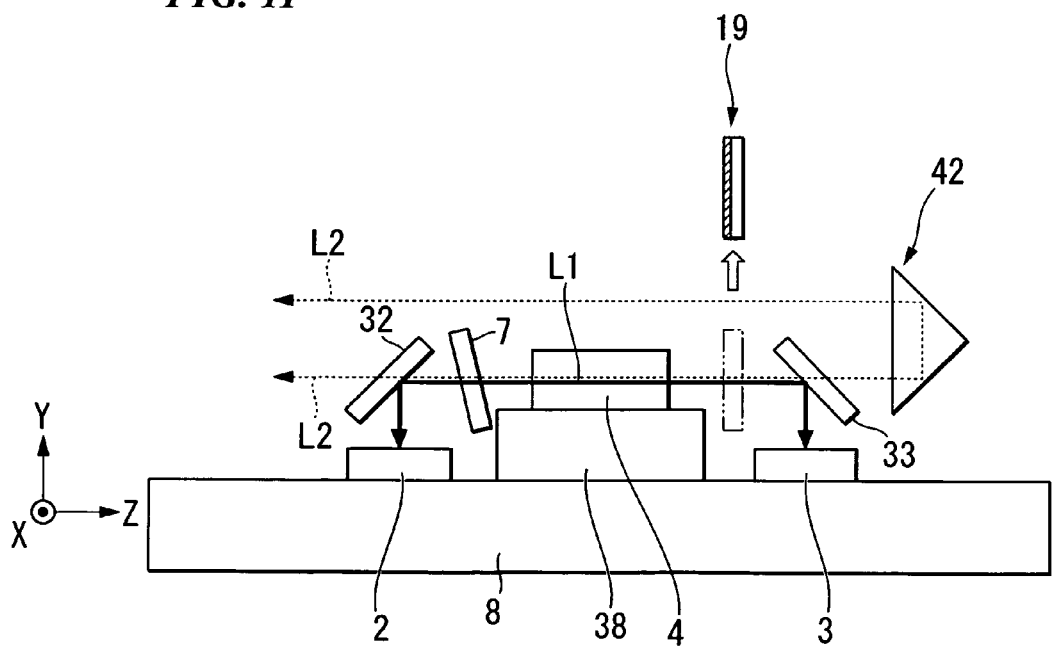
FIG. 11 is a view illustrating the method for manufacturing the laser light source device according to the second embodiment of the invention.

Then, as shown in FIG. 11, in the case when the reflection mirror 19 is removed from the optical path of the infrared laser light L1 emitted from the first and second semiconductor laser element 2 and 3, the emitters of the first and second semiconductor laser elements 2 and 3 are aligned with a high level of precision. As a result, since laser oscillation occurs between two emitters, high-output laser light is obtained.

In addition, in order to further improve the alignment accuracy, the position or installation angle of each of the first and second semiconductor laser elements 2 and 3 may be finely adjusted.

At this time, preferably, a side to which a large amount of electric power is supplied and a side to which a small amount of electric power is supplied alternate between the first semiconductor laser element 2 and the second semiconductor laser element 3 and an operation of adjusting the rotation angle and position of the laser element to which a small amount of electric power is supplied is repeated a plural number of times.

After acquiring sufficient alignment accuracy through the process described above, the positions and installation angles of the first and second semiconductor laser element 2 and 3 are fixed.

Also in the method for manufacturing the laser light source device 31 according to the second embodiment, time and effort required for alignment can be reduced.

As a result, it is possible to obtain the same effects as in the first embodiment, in which the laser light source device capable of obtaining laser light with a higher output can be easily manufactured.

In the second embodiment, both the semiconductor laser elements 2 and 3 can be mounted on one base 8 by adopting the structure in which the optical path in the laser resonator is bent. Accordingly, the configuration of a cooling mechanism of the semiconductor laser elements can be simplified.

Third Embodiment

Hereinafter, a third embodiment of the invention will be described with reference to FIGS. 12 to 17.

A laser light source device according to the third embodiment is the same laser light source device as the first embodiment, in which formation faces (first formation face and second formation face) of semiconductor laser elements faces each other.

Therefore, an explanation of the laser light source device will be omitted.

However, an alignment method of the semiconductor laser element is different from that in the first embodiment.

FIGS. 12 to 17 illustrate a method for manufacturing the laser light source device according to the third embodiment.

Also in these drawings, only optical components required for description of the alignment method are selectively illustrated.

Figure 12:
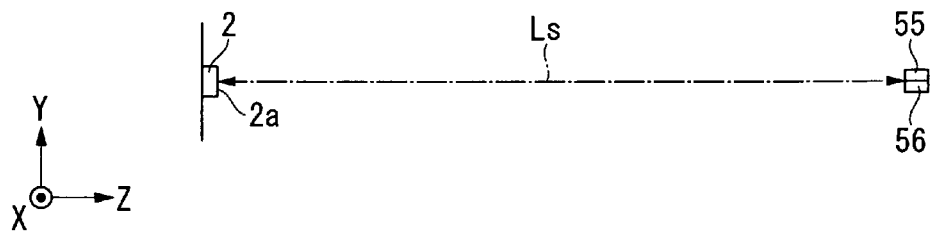
FIG. 12 is a view showing a manufacturing method for manufacturing a laser light source device according to a third embodiment of the invention.

As shown in FIG. 12, reference light is irradiated from a predetermined light source 55 onto the first formation face 2a of the first semiconductor laser element 2.

Then, reflected light from the first semiconductor laser element 2 is detected by a predetermined light receiving element 56, and the arrival position of the reflected light Ls of the reference light is stored.

Figure 13:
FIG. 13 is a view illustrating the method for manufacturing the laser light source device according to the third embodiment of the invention.

Then, as shown in FIG. 13, the reflection mirror 19 (reflection member) is disposed to face the first formation face 2a of the first semiconductor laser element 2.

Reference light is irradiated from the light source 55 toward the reflection mirror 19 in a condition where the position of the light source 55 used in illuminating the reference light onto the first semiconductor laser element 2 in the previous process is made not to move.

Then, the reflected light Ls of the reference light from the reflection mirror 19 is detected by the predetermined light receiving element 56, and the installation angle of the reflection mirror 19 is adjusted so that the reflected light Ls arrives at the same position as that stored in the previous process.

Figure 14:
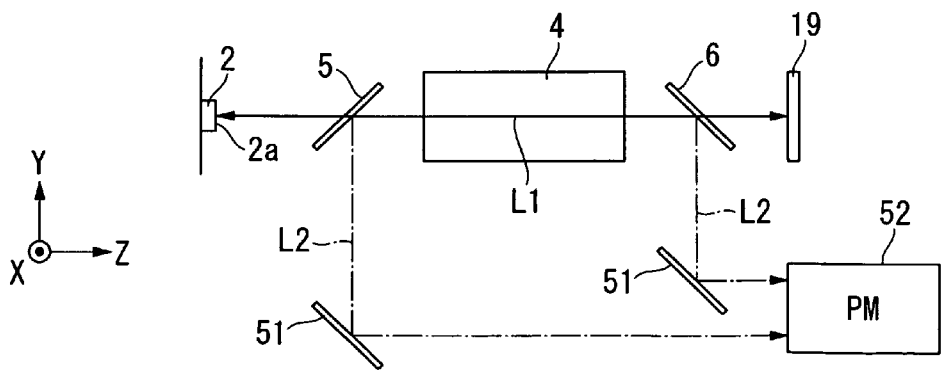
FIG. 14 is a view illustrating the method for manufacturing the laser light source device according to the third embodiment of the invention.

Then, as shown in FIG. 14, the first dichroic mirror 5, the wavelength conversion element 4, and the second dichroic mirror 6 are disposed between the first semiconductor laser element 2 and the reflection mirror 19 and then laser oscillation is caused to occur between the first semiconductor laser element 2 and the reflection mirror 19.

Then, the green laser light L2 whose wavelength has been converted by the wavelength conversion element 4 is extracted therefrom to the outside through the first and second dichroic mirrors 5 and 6 and is then introduced to a photodetector 52, such as a photomultiplier tube, through a mirror 51.

The rotation angle adjustment around the X axis and the rotation angle adjustment around the Y axis of the first semiconductor laser element 2 are performed so that a laser output value becomes the maximum while monitoring the laser output value with the photodetector 52.

This optimizes the relative angle of the first formation face 2a of the first semiconductor laser element 2 with respect to the reflection face of the reflection mirror 19 (adjusting process for adjusting angle of first laser element).

Figure 15:
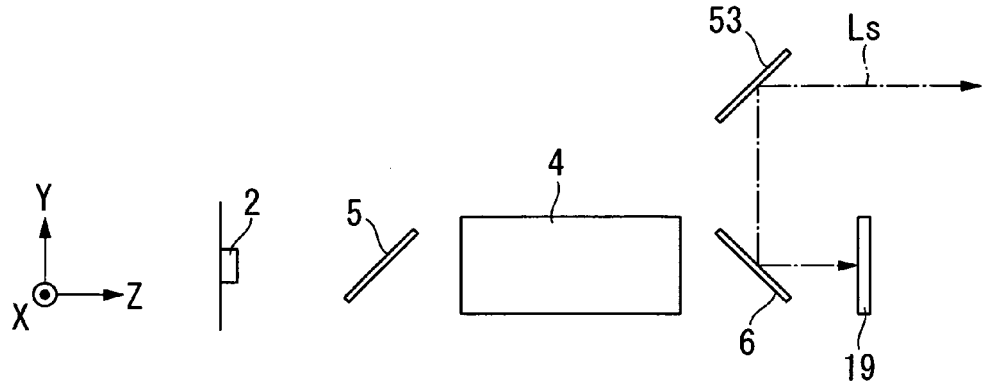
FIG. 15 is a view illustrating the method for manufacturing the laser light source device according to the third embodiment of the invention.

Then, as shown in FIG. 15, reference light is irradiated from a predetermined light source (not shown) toward the reflection mirror 19 through an optical-path changing mirror 53 (optical-path changing member) and the second dichroic mirror 6 in a condition where the reflection mirror 19 is made not to move from the previous process.

Then, the reflected light Ls of the reference light returned from the reflection mirror 19 through the second dichroic mirror 6 and the optical-path changing mirror 53 is detected by the predetermined light receiving element 56, and the installation angle of the optical-path changing mirror 53 is adjusted so that the reflected light Ls returns to the same position as a light emission point of the reference light, for example.

At this time, the arrival position of the reflected light Ls is stored.

In addition, in the third embodiment, the second dichroic mirror 6 functions as an optical-path changing member similar to the optical-path changing mirror 53.

Figure 16:
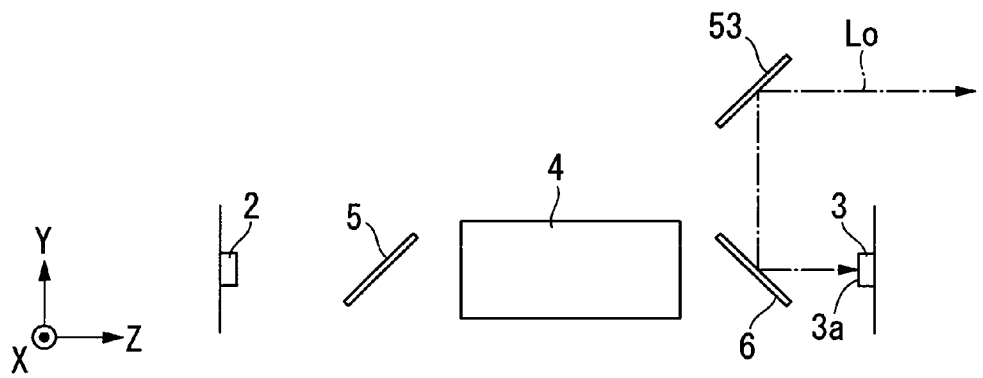
FIG. 16 is a view illustrating the method for manufacturing the laser light source device according to the third embodiment of the invention.

Then, as shown in FIG. 16, the reflection mirror 19 is substituted with the second semiconductor laser element 3 and laser light is emitted from the second semiconductor laser element 3.

Then, laser light L0 emitted from the second semiconductor laser element 3 through the second dichroic mirror 6 and the optical-path changing mirror 53 is detected by the predetermined light receiving element 56, and the rotation angle adjustment around the X axis and the rotation angle adjustment around the Y axis of the second semiconductor laser element 3 are performed so that the laser light arrives at the same position as that stored in the previous process.

This optimizes the relative angle of the second formation face 3a of the second semiconductor laser element 3 with respect to the reflection face of the reflection mirror 19 (adjusting process for adjusting angle of second laser element).

Figure 17:
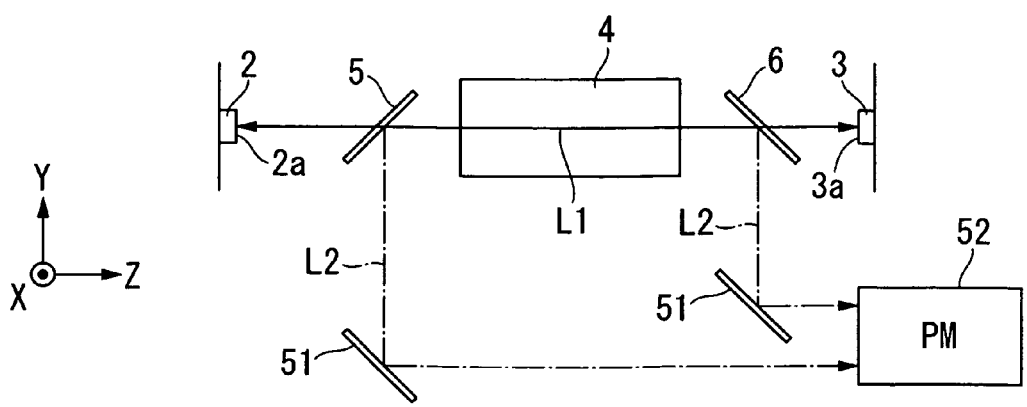
FIG. 17 is a view illustrating the method for manufacturing the laser light source device according to the third embodiment of the invention.

Then, as shown in FIG. 17, laser oscillation is caused to occur between the first semiconductor laser element 2 and the second semiconductor laser element 3.

Then, the green laser light L2 whose wavelength has been converted by the wavelength conversion element 4 is extracted therefrom to the outside by the first and second dichroic mirrors 5 and 6 and is then introduced to the photodetector 52, such as a photomultiplier tube, through the mirror 51.

The positional adjustment in the X axis direction, the positional adjustment in the Y axis direction, and the rotation angle adjustment around the Z axis of the first and second semiconductor laser elements 2 and 3 are performed so that a laser output value becomes the maximum while monitoring the laser output value with the photodetector 52.

This optimizes the relative rotation angles and relative positions of the first and second semiconductor laser elements 2 and 3 within a plane including the first formation face 2a of the first semiconductor laser element 2 and the second formation face 3a of the second semiconductor laser element 3 (adjusting process for adjusting angle and position).

Also, in the third embodiment, the position or installation angle of each of the first and second semiconductor laser elements 2 and 3 may be finely adjusted in the process shown in FIG. 17 in order to improve the alignment accuracy, in the same manner as the first and second embodiments.

At this time, preferably, a side to which a large amount of electric power is supplied and a side to which a small amount of electric power is alternately supplied between the first semiconductor laser element 2 and the second semiconductor laser element 3 and an operation of adjusting the rotation angle and position of the laser element to which a small amount of electric power is supplied is repeated a plural number of times.

After acquiring sufficient alignment accuracy through the process described above, the positions and installation angles of the first and second semiconductor laser element 2 and 3 are fixed.

Also, in the method for manufacturing the laser light source device according to the third embodiment, time and effort required for alignment can be reduced. As a result, it is possible to obtain the same effects as in the first embodiment, in which the laser light source device capable of obtaining laser light with a higher output can be easily manufactured.

In the third embodiment, the second formation face 3a of the second semiconductor laser element 3 is indirectly aligned from the same side as the first formation face 2a of the first semiconductor laser element 2 by using the reflection mirror 19 as a reference, as shown in FIG. 16.

As a result, the second formation face 3a of the second semiconductor laser element 3 is aligned with respect to the first formation face 2a of the first semiconductor laser element 2.

According to the method described above, the second semiconductor laser element 3 can be aligned without carrying out laser oscillation of the second semiconductor laser element 3 by using the reference light.

In addition, the technical scope of the invention is not limited to the above embodiments, but various modifications may be made without departing from the spirit and scope of the invention.

For example, although each semiconductor laser element is configured to include a plurality of emitters in the embodiments described above, each semiconductor laser element may also be configured to include only one emitter.

In this case, since the rotation angle adjustment around the Z axis (Rz) shown in FIG. 2 becomes easy, the laser light source device can be manufactured more easily.

In addition, although the second semiconductor laser element is aligned after aligning the first semiconductor laser element, the first semiconductor laser element may be aligned after aligning the second semiconductor laser element.

In the embodiments described above, examples in which the invention is applied to the laser light source devices, each of which includes the wavelength conversion element and outputs light from the semiconductor laser element after converting the wavelength thereof, are illustrated. However, the wavelength conversion element may not necessarily be provided. For example, the invention may also be applied to a laser light source device that outputs light from the semiconductor laser element without converting the wavelength of the light.

In the second embodiment, an example of the configuration where the optical path is bent between the first semiconductor laser element and the wavelength conversion element, and between the second semiconductor laser element and the wavelength conversion element has been mentioned.

However, the configuration may be adopted where the optical path is bent in the L shape either between the first semiconductor laser element and the wavelength conversion element, or between the second semiconductor laser element and the wavelength conversion element.

While preferred embodiments of the invention have been described and illustrated above, these are exemplary examples of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A manufacturing method for manufacturing a laser light source device, comprising:

providing a first laser element that has a first emitter emitting light and a first formation face on which the first emitter is formed, a second laser element that has a second emitter emitting light and a second formation face on which the second emitter is formed, and a reflection member having at least one face that is a reflection face;

disposing the first laser element and the second laser element so that the first formation face is opposed to the second formation face;

disposing the reflection member in an optical path of the light emitted from the first laser element;

adjusting a relative angle between the first formation face and the reflection face while causing the first laser element to emit the light and producing a laser oscillation between the first laser element and the reflection member;

adjusting a relative angle of the second formation face relative to the first formation face by using the reflection member, while maintaining a positional relationship at which the laser oscillation is produced between the first laser element and the reflection member; and adjusting a relative rotation angle between the first laser element and the second laser element and a relative position between the first laser element and the second laser element, on a plane orthogonal to an optical path of the light emitted from the first laser element and on a plane orthogonal to an optical path of the light emitted from the second laser element, while producing laser oscillation by both the light emitted from the first laser element and the light emitted from the second laser element, so that the light emitted from the first emitter is incident into the second emitter and so that the light emitted from the second emitter is incident into the first emitter.

2. The manufacturing method according to claim 1, wherein
the adjusting of the relative angle of the second formation face includes:
providing a light source emitting reference light;
providing an optical-path changing member whose angle relative to an optical path of the reference light is adjustable, that is disposed in the optical path of the reference light, that leads the reference light to be incident into the reflection member in the same direction as a direction in which the laser light emitted from the first laser element is incident into the reflection member, and that leads the reference light to be reflected at the reflection face;
determining an angle at which the optical-path changing member is set based on a relative positional relationship between the reference light that is incident into the reflection member and the reference light that has been reflected from the reflection member;
substituting the second laser element for the reflection member and causing the second laser element to emit the light after determining the angle at which the optical-path changing member is set; and
adjusting the relative angle of the second formation face relative to the first formation face based on the relative positional relationship between the light emitted from the second laser element through the optical-path changing member and the reference light that has been reflected from the reflection member.

3. The manufacturing method according to claim 2, wherein
the adjusting of the relative rotation angle and the relative position includes:
causing at least one of the first laser element and the second laser element to emit the light, thereby oscillating the laser between the first emitter and the second emitter; and
adjusting the relative rotation angle and the relative position by monitoring the output value of the laser.

4. The manufacturing method according to claim 3, wherein
when the light is emitted from at least one of the first laser element and the second laser element, an amount of electric power that is supplied to the first laser element is different from an amount of electric power that is supplied to the second laser element, and a relatively small amount of electric power or a relatively large amount of electric power is supplied to each of the first laser element and the second laser element, and wherein
a rotation angle and a position of the first laser element or the second laser element, to which the relatively small amount of electric power is supplied, is adjusted.

5. The manufacturing method according to claim 4, wherein
the rotation angle and the position of the first laser element to which the relatively small amount of electric power is supplied is adjusted, after alternately switching the relatively small amount of electric power and the relatively large amount of electric power that are supplied to the first laser element and the second laser element, respectively, and wherein
the rotation angle and the position of the second laser element to which the relatively small amount of electric power is supplied is adjusted, after alternately switching the relatively small amount of electric power and the relatively large amount of electric power that are supplied to the first laser element and the second laser element, respectively.

6. The manufacturing method according to claim 1, wherein
the adjusting of the relative angle of the second formation face includes:
adjusting the relative angle of the second formation face relative to the reflection face of the reflection member while causing the second laser element to emit the light and producing a laser oscillation between the second laser element and the reflection member.

7. The manufacturing method according to claim 6, wherein
the reflection member has the reflection face that causes a part of the light that has been incident into the reflection member to be transmitted through, and wherein
the adjusting of the relative rotation angle and the relative position includes:
disposing the reflection member in an optical path of the light emitted from the first laser element and the light emitted from the second laser element;
observing a first spot that is formed by the light emitted from the first laser element and a second spot that is formed by the light emitted from the second laser element in view from a side of the reflection member; and
adjusting the relative rotation angle between the first laser element and the second laser element and the relative position between the first laser element and the second laser element so that a position of the first spot is coincided with a position of the second spot.

8. The manufacturing method according to claim 7, wherein
the adjusting of the relative rotation angle and the relative position includes:
alternately producing laser oscillation by the first laser element and the laser oscillation by the second laser element.

9. The manufacturing method according to claim 7, wherein
the adjusting of the relative rotation angle and the relative position includes:
removing the reflection member from the optical path of the light emitted from the first laser element and the light emitted from the second laser element after the reflection member was used to adjust the relative rotation angle between the first laser element and the second laser element and the relative position between the first laser element and the second laser element;
causing at least one of the first laser element and the second laser element to emit the light, thereby oscillating the laser between the first emitter and the second emitter; and
adjusting the relative rotation angle and the relative position by monitoring the output value of the laser.

10. The manufacturing method according to claim 9, wherein
when the light is emitted from at least one of the first laser element and the second laser element, an amount of electric power that is supplied to the first laser element is different from an amount of electric power that is supplied to the second laser element, and a relatively small amount of electric power or a relatively large amount of electric power is supplied to each of the first laser element and the second laser element, and wherein a rotation angle and a position of the first laser element or the second laser element, to which the relatively small amount of electric power is supplied, is adjusted.

11. The manufacturing method according to claim 10, wherein the rotation angle and the position of the first laser element to which the relatively small amount of electric power is supplied is adjusted, after alternately switching the relatively small amount of electric power and the relatively large amount of electric power that are supplied to the first laser element and the second laser element, respectively, and wherein the rotation angle and the position of the second laser element to which the relatively small amount of electric power is supplied is adjusted, after alternately switching the relatively small amount of electric power and the relatively large amount of electric power that are supplied to the first laser element and the second laser element, respectively.

12. The manufacturing method according to claim 1, wherein the adjusting of the relative angle of the second formation face includes:

causing the light emitted from the second laser element to be incident into the opposite side of the reflection member into which the light emitted from the first laser element is incident in the adjusting of the relative angle of the first formation face.

13. The manufacturing method according to claim 12, wherein the reflection member is configured by an optically transparent plate member having one face only on which a reflection layer is formed, and the reflection layer has a first face outwardly exposed to the optically transparent plate member and a second face that is in contact with the optically transparent plate member, and wherein one of the light emitted from the first laser element in the adjusting of the relative angle of the first formation face and the light emitted from the second laser element in the adjusting of the relative angle of the second formation face is incident into the first face of the reflection layer, and the other of the light emitted from the first laser element in the adjusting of the relative angle of the first formation face and the light emitted from the second laser element in the adjusting of the relative angle of the second formation face is incident into the second face of the reflection layer through the optically transparent plate member.

14. The manufacturing method according to claim 1, wherein the reflection member is configured by an optically transparent plate member having one face only on which a reflection layer is formed.

15. The manufacturing method according to claim 1, wherein the reflection member diffuses a part of the light that has been incident into the reflection face.

16. The manufacturing method according to claim 1, further comprising:

disposing a wavelength conversion element that converts a basic wavelength-band of light that has been incident into the wavelength conversion element into a wavelength-band different from the basic wavelength-band of the light, in an optical path of the light emitted from the first laser element and the light emitted from the second laser element.

17. The manufacturing method according to claim 16, further comprising:

disposing a wavelength separating element that separates the light that has emitted from the first laser element and the second laser element into the light of the basic wavelength-band and into light different from the light of the basic wavelength-band, between the first laser element and the wavelength conversion element, and between the second laser element and the wavelength conversion element.

18. The manufacturing method according to claim 17, wherein the wavelength separating element reflects the light of the basic wavelength-band and transmits the light different from the light of the basic wavelength-band.

19. The manufacturing method according to claim 1, wherein each of the first laser element and the second laser element includes a plurality of emitters.

20. A laser light source device manufactured by the manufacturing method according to claim 1, comprising:

a first laser element that has a first emitter emitting light and a first formation face on which the first emitter is formed; and a second laser element that has a second emitter emitting light and a second formation face on which the second emitter is formed, and a reflection member having at least one face that is a reflection face.

* * * * *